(12) United States Patent
D'Inca et al.

(10) Patent No.: US 11,032,950 B2
(45) Date of Patent: Jun. 8, 2021

(54) EQUIPMENT COOLING SYSTEM AND METHOD

(71) Applicant: Telefonaktiebolaget LM Ericsson (publ), Stockholm (SE)

(72) Inventors: Claudio D'Inca, Genoa (IT); Sergio Lanzone, Genoa (IT); Angelo Rivara, Genoa (IT)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 80 days.

(21) Appl. No.: 16/347,240

(22) PCT Filed: Nov. 3, 2016

(86) PCT No.: PCT/EP2016/076601
§ 371 (c)(1),
(2) Date: May 3, 2019

(87) PCT Pub. No.: WO2018/082777
PCT Pub. Date: May 11, 2018

(65) Prior Publication Data
US 2019/0335622 A1     Oct. 31, 2019

(51) Int. Cl.
*H05K 7/20* (2006.01)
*F28D 15/02* (2006.01)
*G06F 1/20* (2006.01)

(52) U.S. Cl.
CPC ..... *H05K 7/20681* (2013.01); *F28D 15/0266* (2013.01); *G06F 1/20* (2013.01); *H05K 7/20827* (2013.01)

(58) Field of Classification Search
CPC .. H05K 7/20; H05K 7/20681; H05K 7/20827; H05K 7/20663; H05K 7/208; F28D 15/0266; G06F 1/20; F25B 25/00
See application file for complete search history.

(56) References Cited

U.S. PATENT DOCUMENTS 8,659,899 B2 * 2/2014 Wei ............... H05K 7/20827
361/700
2004/0223300 A1 * 11/2004 Fink ................... H05K 7/20
361/690

(Continued)

FOREIGN PATENT DOCUMENTS

DE     4108981 A1    10/1992
EP     2347642 A1    7/2011

*Primary Examiner* — Emmanuel E Duke
(74) *Attorney, Agent, or Firm* — Murphy, Bilak & Homiller, PLLC

(57) ABSTRACT

A cooling system (100) for equipment is disclosed, the equipment comprising an air ingress (104) and an air egress (106). The cooling system comprises a compression chamber (108) arranged to compress air exiting the equipment from the equipment air egress (106), and a refrigerant circuit (110) comprising a condenser coil (112), an evaporator coil (114) and a conduit (116) arranged to convey refrigerant fluid between the condenser coil (112) and the evaporator coil (114). The evaporator coil (114) is arranged to cool air entering the equipment at the equipment air ingress (104) and the condenser coil (112) is located within the compression chamber (108). Also disclosed are methods (300, 400) and apparatus for cooling equipment.

16 Claims, 6 Drawing Sheets

(56) References Cited

U.S. PATENT DOCUMENTS

| | | | |
|---|---|---|---|
| 2009/0310300 A1* | 12/2009 | Chrysler | H05K 7/20681 361/691 |
| 2011/0091336 A1* | 4/2011 | Lewis | F04B 53/08 417/321 |
| 2012/0186291 A1 | 7/2012 | Kaellmark et al. | |
| 2013/0155607 A1 | 6/2013 | Wei | |

* cited by examiner

EQUIPMENT COOLING SYSTEM AND METHOD

TECHNICAL FIELD

The present disclosure relates to a cooling system for equipment and to a method for cooling equipment. The equipment may for example be telecommunications equipment. The present disclosure also relates to apparatus for equipment cooling and to a computer program and computer program product configured, when run on a computer, to carry out a method for cooling equipment.

BACKGROUND

Computing equipment, such as networking equipment and other telecommunications equipment, generates heat, owing to the high concentration of optical and electrical components. Such heat generation, if it is not adequately managed, can become detrimental to the correct operation of the equipment for example if the heat generated by the equipment causes the equipment temperature to rise above a safe operating threshold. The issue of heat generation is often accentuated by the fact that telecommunications equipment tends to be concentrated in central offices, plant rooms or dedicated data centres.

In order to promote thermal dissipation, telecommunications systems are frequently equipped with fan tray units, which establish a continuous flow of air over and through the equipment, removing the generated heat and cooling the equipment. As the performance requirements for optical and digital equipment continue to increase, so the issue of unwanted heat generation becomes more significant, generating a requirement for ever more powerful fans.

Fan cooling of equipment is only effective if the air temperature at ingress to the equipment is kept below a certain value. Consequently, central offices, plant rooms and data centres are conventionally provided with powerful air conditioning systems to keep the ambient air temperature within a range of 27 to 29 degrees Celsius.

FIG. 1 illustrates a typical arrangement 2 for cooling of telecommunications equipment 4 located within a central office 6. The telecommunications equipment 4 is provided with a fan tray 8, which ensures a continuous flow of air from an air ingress 10 to an air egress 12. An air conditioning unit 14 maintains an ambient temperature in the room at within predetermined operating range.

The conventional arrangement illustrated in FIG. 1 is associated with several disadvantages, including increased power consumption to supply the fans and the air conditioning unit, and undesirable noise from operation of the fan trays. In addition, the design of both the room housing the equipment and the equipment itself is complicated by the need to accommodate air conditioning and fan trays respectively.

SUMMARY

It is an aim of the present disclosure to provide a method and apparatus which obviate or reduce at least one or more of the challenges mentioned above.

According to a first aspect of the present disclosure, there is provided a cooling system for equipment, the equipment comprising an air ingress and an air egress. The cooling system comprises a compression chamber arranged to compress air exiting the equipment from the equipment air egress, and a refrigerant circuit comprising a condenser coil, an evaporator coil and a conduit arranged to convey refrigerant fluid between the condenser coil and the evaporator coil. The evaporator coil is arranged to cool air entering the equipment at the equipment air ingress and the condenser coil is located within the compression chamber.

In some examples of the present disclosure, the equipment may be telecommunications equipment such as a server, and may be located in a plant room, central office or data centre.

According to examples of the present disclosure, the refrigerant circuit may further comprise a compressor configured to compress refrigerant vapour exiting the evaporation coil.

According to examples of the present disclosure, the compressor may be configured to compress the refrigerant vapour to its saturation limit so as to force condensation of the refrigerant vapour.

According to examples of the present disclosure, the refrigerant circuit may further comprise an expansion valve configured to reduce pressure of refrigerant liquid exiting the condenser coil.

According to examples of the present disclosure, the expansion valve may be configured to reduce the pressure of the refrigerant liquid such that partial evaporation of the refrigerant liquid occurs.

According to examples of the present disclosure, the expansion valve may be configured to reduce the pressure of the refrigerant liquid such that the refrigerant liquid-vapour mixture is cooled to a temperature below an ambient temperature.

In examples of the present disclosure, cooling below an ambient temperature may ensure that ambient air at the air ingress will be warmer that the refrigerant liquid-vapour mix and will therefore be cooled by heat exchange with the refrigerant, completing evaporation of the refrigerant liquid-vapour mix. In some examples of the present disclosure, an ambient temperature range in normal use may be between −5 and +55 degrees Celsius.

According to examples of the present disclosure, the compression chamber may comprise a plurality of turbines configured to increase pressure of the air exiting the equipment from the equipment air egress.

According to examples of the present disclosure, the turbines may be configured to draw air across the equipment from the equipment air ingress to the equipment air egress.

According to examples of the present disclosure, the compression chamber may be arranged to compress the air exiting the equipment from the equipment air egress such that a temperature of the air exiting the equipment from the equipment air egress is raised to a target temperature.

According to examples of the present disclosure, the turbines may be regulated to provide sufficient compression to achieve the target temperature.

According to examples of the present disclosure, a difference between the target temperature and an ambient temperature may be sufficient to drive the cycle of refrigerant fluid through the refrigerant circuit.

According to examples of the present disclosure, the exact value of the target temperature may be determined by the nature of the refrigerant fluid and the ambient air temperature, these factors determining both a size of a thermal gap required to drive the refrigerant cycle and a reference temperature for the thermal gap, which is the ambient air temperature.

According to examples of the present disclosure, the cooling system may further comprise fans arranged to draw air from the equipment air ingress to the equipment air egress.

According to another aspect of the present disclosure, there is provided a method for cooling equipment, the equipment comprising an air ingress and an air egress. The method comprises flowing air across the equipment from the air ingress to the air egress, compressing air exiting the equipment from the equipment air egress such that a temperature of the air is increased above an air egress temperature, and using a difference between the temperature of the compressed egress air and an ambient temperature to drive a refrigerant cycle to cool air entering the equipment at the equipment air ingress.

In some examples of the present disclosure, flowing air across the equipment may comprise forcing air across the equipment using fans and/or drawing air across the equipment using turbines providing compression of the air exiting the equipment.

According to examples of the present disclosure, compressing air exiting the equipment from the equipment air egress such that the temperature of the air is increased above an air egress temperature may comprise drawing air exiting the equipment into a compression chamber and subjecting the air to compression from turbines.

According to examples of the present disclosure, compressing air exiting the equipment from the equipment air egress such that the temperature of the air is increased above an air egress temperature may comprise compressing the air exiting the equipment until the temperature of the air is raised to a target temperature.

According to examples of the present disclosure, a difference between the target temperature and an ambient temperature may be sufficient to drive the cycle of refrigerant fluid through a refrigerant circuit.

According to examples of the present disclosure, using a difference between the temperature of the compressed egress air and an ambient temperature to drive a refrigerant cycle to cool air entering the equipment at the equipment air ingress may comprise heating a condensed, compressed liquid refrigerant using the compressed egress air, cooling the condensed, compressed liquid refrigerant using ambient air, expanding the cooled condensed liquid refrigerant to partial evaporation and additional cooling, evaporating the cooled, expanded liquid-vapour refrigerant mixture to cool air entering the equipment at the equipment air ingress, and compressing the expanded vapour refrigerant to condensation.

According to examples of the present disclosure, expanding the cooled condensed liquid refrigerant to partial evaporation and additional cooling may comprise expanding the cooled condensed liquid refrigerant such that the liquid-vapour refrigerant mixture is cooled to a temperature below an ambient temperature.

According to another aspect of the present disclosure, there is provided a computer program comprising instructions which, when executed on at least one processor, cause the at least one processor to carry out a method according to any one of the preceding aspects or examples of the present disclosure.

According to another aspect of the present disclosure, there is provided a carrier containing a computer program according to a preceding aspect of the present disclosure, wherein the carrier comprises one of an electronic signal, optical signal, radio signal or computer readable storage medium.

According to another aspect of the present disclosure, there is provided a computer program product comprising non transitory computer readable media having stored thereon a computer program according to a preceding aspect of the present disclosure.

According to another aspect of the present disclosure, there is provided apparatus for cooling equipment, the equipment comprising an air ingress and an air egress. The apparatus is adapted to flow air across the equipment from the air ingress to the air egress, compress air exiting the equipment from the equipment air egress such that a temperature of the air is increased above an air egress temperature, and use a difference between the temperature of the compressed egress air and an ambient temperature to drive a refrigerant cycle to cool air entering the equipment at the equipment air ingress.

According to another aspect of the present disclosure, there is provided apparatus for cooling equipment, the equipment comprising an air ingress and an air egress. The apparatus comprises a processor and a memory, the memory containing instructions executable by the processor such that the apparatus is operable to flow air across the equipment from the air ingress to the air egress, compress air exiting the equipment from the equipment air egress such that a temperature of the air is increased above an air egress temperature, and use a difference between the temperature of the compressed egress air and an ambient temperature to drive a refrigerant cycle to cool air entering the equipment at the equipment air ingress.

BRIEF DESCRIPTION OF THE DRAWINGS

For a better understanding of the present disclosure, and to show more clearly how it may be carried into effect, reference will now be made, by way of example, to the following drawings in which.

DETAILED DESCRIPTION

Aspects of the present disclosure provide an equipment cooling system in which the heat generated by the equipment to be cooled is used to drive a refrigerant cycle which provides cooling of air entering the equipment. The heat generated by the equipment may be supplemented by compression of air leaving the equipment, the compression raising the temperature of the air leaving the equipment, such that a thermal gap of sufficient size may be established with respect to the ambient air to drive the refrigerant cycle.

Figure 1:
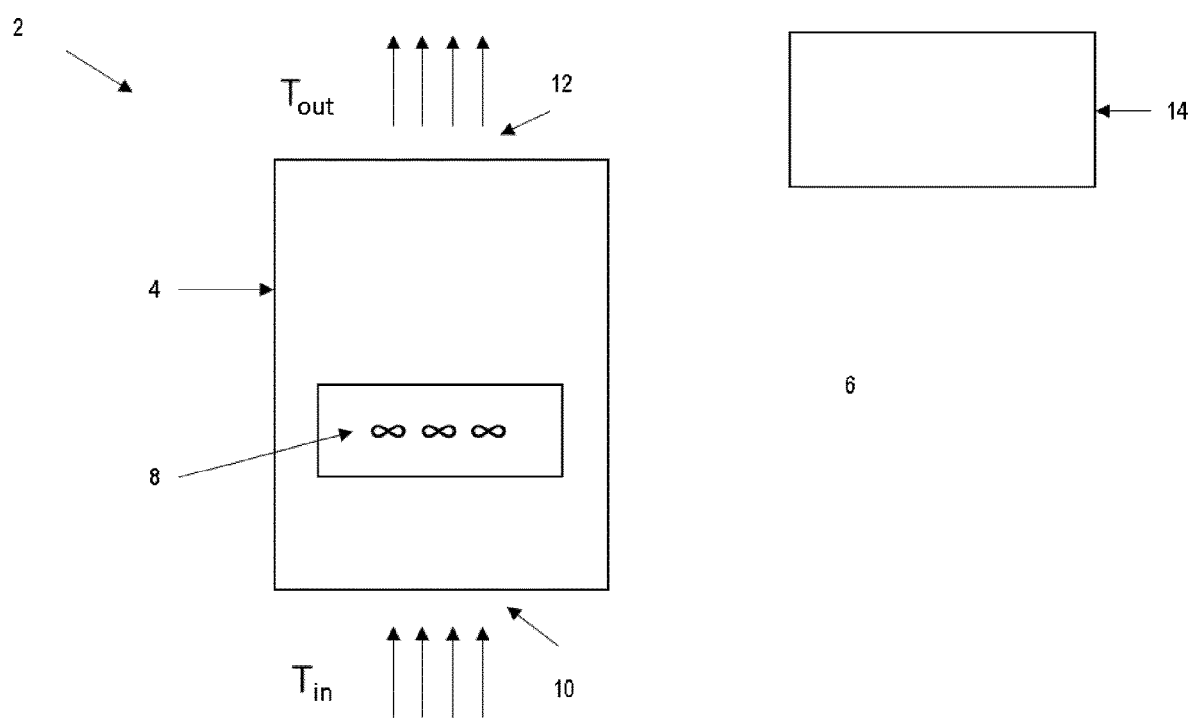
FIG. 1 is a schematic representation of a conventional cooling arrangement.
Figure 2:
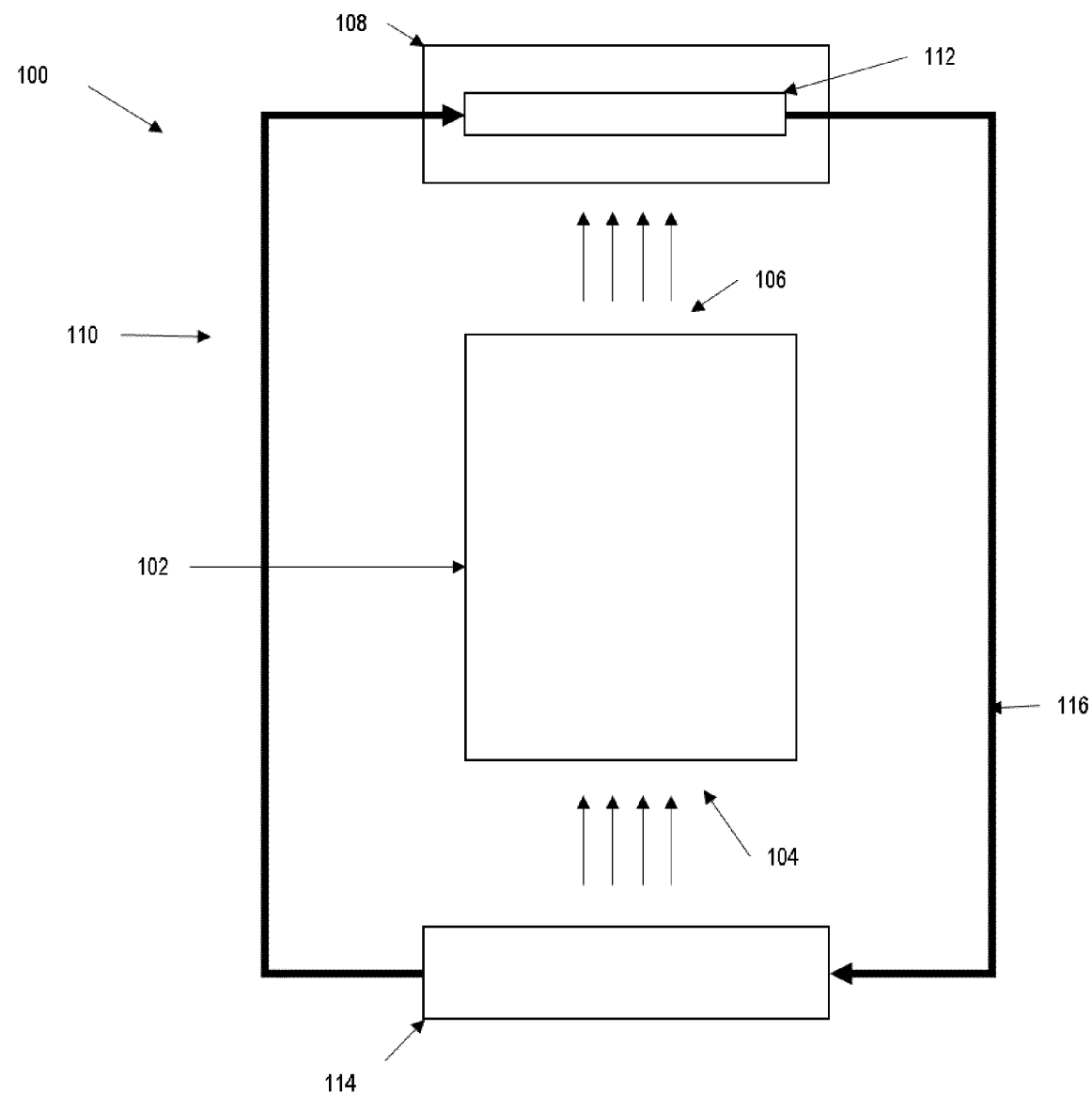
FIG. 2 is a block diagram illustrating an equipment cooling system.

FIG. 2 illustrates a first example of cooling system 100 according to an aspect of the present disclosure. Referring to FIG. 2, the cooling system is arranged to cool equipment 102, the equipment comprising an air ingress 104 and an air egress 106. The cooling system itself comprises a compression chamber 108 arranged to compress air exiting the equipment from the equipment air egress 106. The cooling system further comprises a refrigerant circuit 110 comprising a condenser coil 112, an evaporator coil 114 and a conduit 116 arranged to convey refrigerant fluid between the condenser coil 112 and the evaporator coil 114. The evaporator coil 114 is arranged to cool air entering the equipment 102 at the equipment air ingress 104 and the condenser coil 112 is located within the compression chamber. Air exiting the equipment at the equipment egress 106 is heated by the heat generated by the equipment 102, and then is further heated by compression in the compression chamber 108. Refrigerant fluid in the condenser coil is heated thanks to the heated air inside the compression chamber, and a thermal gap between the temperature of the heated air in the compression chamber, and the ambient air surrounding the equipment, drives the refrigerant cycle, allowing air entering the equipment at the air ingress 104 to be cooled by heat exchange with the refrigerant fluid in the evaporator coil 114.

Figure 3:
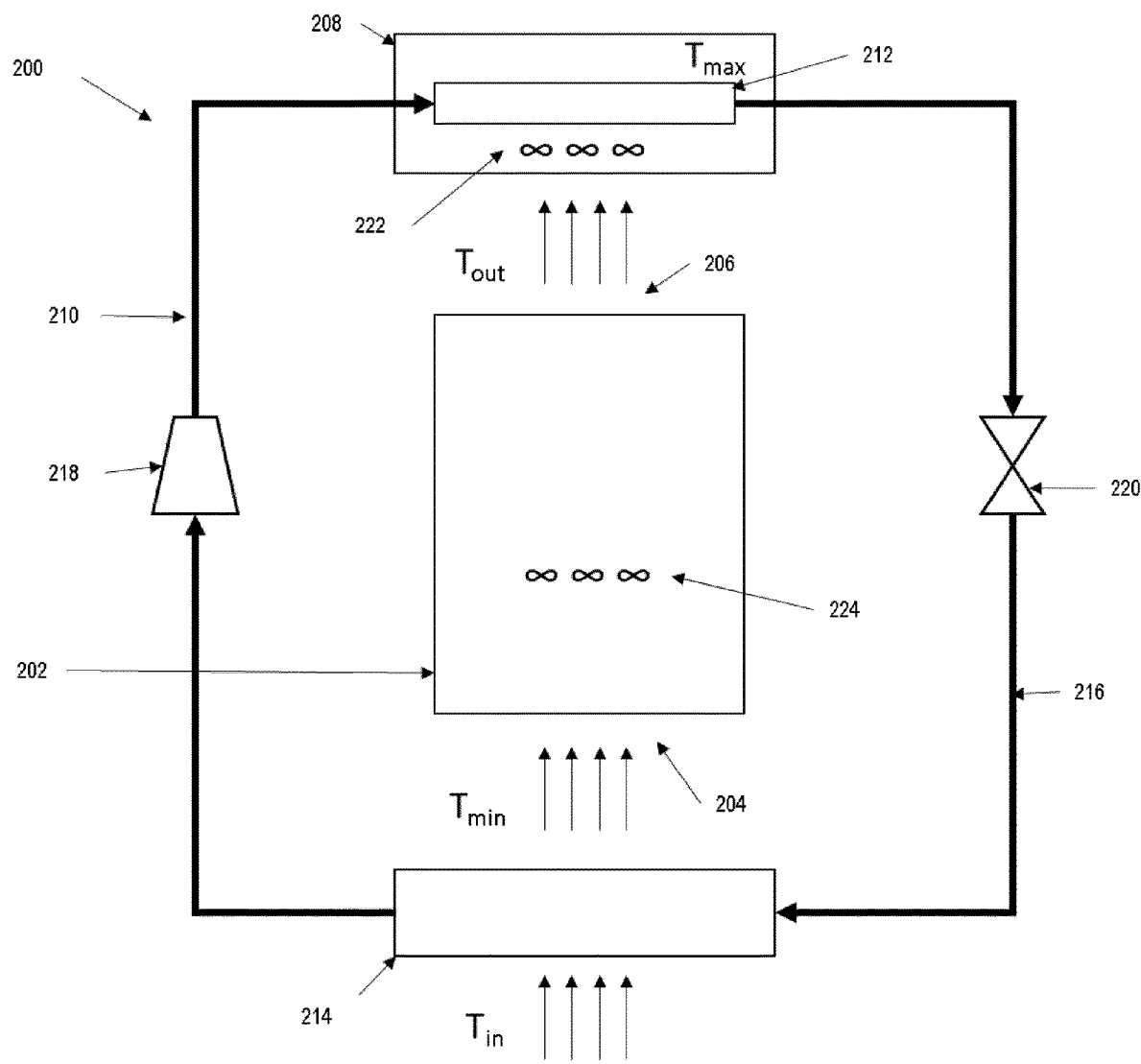
FIG. 3 is a block diagram illustrating another example of equipment cooling system.

FIG. 3 illustrates another example of cooling system 200, in which the elements of cooling system 100 are supplemented with additional elements, as discussed in greater detail below. Referring to FIG. 3, the cooling system 200 is arranged to cool equipment 202, the equipment comprising an air ingress 204 and an air egress 206. As for the cooling system 100 of FIG. 2, the cooling system 200 of FIG. 3 comprises a compression chamber 208 arranged to compress air exiting the equipment from the equipment air egress 206. The cooling system further comprises a refrigerant circuit 210 comprising a condenser coil 212, an evaporator coil 214 and a conduit 216 arranged to convey refrigerant fluid between the condenser coil 212 and the evaporator coil 214. The evaporator coil 214 is arranged to cool air entering the equipment 202 at the equipment air ingress 204 and the condenser coil 212 is located within the compression chamber. The refrigerant circuit 210 also comprises a compressor 218, configured to compress refrigerant vapour exiting the evaporation coil 214, and an expansion valve 220, configured to reduce pressure of refrigerant liquid exiting the condenser coil 212. The compression chamber 208 comprises a plurality of turbines 222 configured to increase pressure of the air exiting the equipment from the equipment air egress 206. A plurality of fans 224 may be arranged to draw air across the equipment 202 from the air ingress 204 to the air egress 206.

In use, a refrigerant fluid is provided within the refrigerant circuit, and a refrigerant cycle, including state changes from liquid to vapour and back to liquid, is used to cool air entering the equipment at the air ingress 204. The refrigerant cycle is driven by a thermal gap between an ambient temperature, which is also the temperature of air approaching the air ingress, and a temperature of compressed air exiting the air equipment at the air egress 206 and via the compression chamber 208. In some examples of the present disclosure, an ambient temperature range in normal use may be between −5 and +55 degrees Celsius.

Air exiting the equipment at the equipment egress 106 is heated by the heat generated by the equipment 102 to a temperature $T_{out}$, which is greater than the ambient temperature. This air is then further heated by compression in the compression chamber 208 to a temperature $T_{max}$. The compression within the compression chamber 208 is provided by the turbines 222, although other compression solutions may be envisaged. The operation of the turbines 222, or other compression equipment, may be regulated, for example via a feedback loop, to ensure that the air temperature within the compression chamber is maintained at the desired $T_{max}$. The precise value of $T_{max}$ will be determined by the nature of the refrigerant fluid and, the ambient air temperature and the required cooling temperature for air entering the equipment 202.

Heat from the compressed air within the compression chamber 208 is absorbed by refrigerant liquid flowing through the condenser coil 212. The refrigerant liquid is at high pressure, having been compressed by the compressor 218. High temperature and pressure refrigerant liquid then exits the condenser coil 212, and the compression chamber 208, and is cooled by the ambient air outside the compression chamber 208. The liquid refrigerant then flows through the expansion valve 220, in which the pressure of the refrigerant liquid is reduced such that partial evaporation of the refrigerant liquid occurs and the temperature of the resulting liquid-vapour mixture is cooled to a temperature below the ambient temperature. The cooled liquid-vapour refrigerant mixture then enters the evaporator coil 214, where it evaporates fully, cooling as it does so the ambient air at the egress to the equipment from temperature $T_{in}$ to $T_{min}$. The refrigerant vapour then enters the compressor 218, where the refrigerant vapour is compressed to its saturation limit so as to force condensation of the refrigerant vapour and raising the temperature of the resulting refrigerant liquid. The heated refrigerant liquid then re-enters the condenser coil 212 inside the compression chamber 208, where it is further heated by the compressed air, and the cycle continues.

The ambient air entering the equipment 202 is thus cooled from $T_{in}$ to $T_{min}$ by heat exchange with the refrigerant liquid-vapour mixture in the evaporator coil. The heat generated by the equipment raises the temperature of the air flowing across and through it from $T_{min}$ to $T_{out}$, and egress air is then further heated to the $T_{max}$ required to drive the refrigerant cycle by compression in the compression chamber 208. The air flowing across the equipment may be drawn by the action of the turbines 222, which generate a vacuum, so drawing air from the air ingress 204 to fill the vacuum. In other examples, the action of the turbines 222 may be augmented by dedicated fans 224 located on or adjacent the equipment 202. The temperature $T_{min}$ is sufficiently low to enable the air flowing across the equipment to remove enough heat generated by the equipment to maintain the equipment at a temperature within its operating range.

Figure 4:
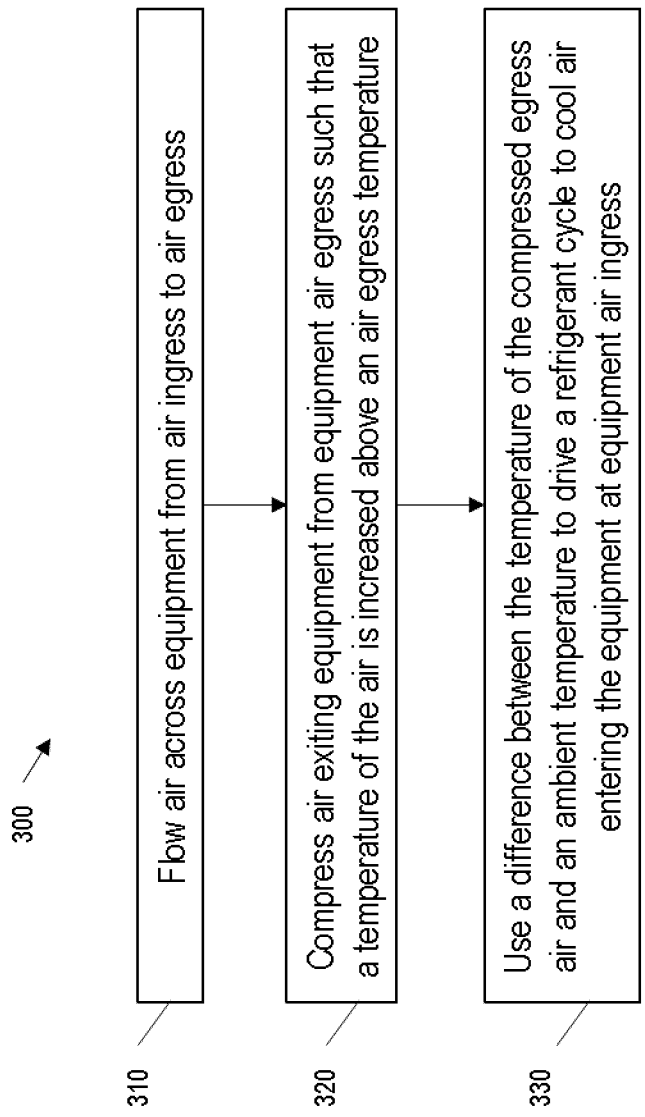
FIG. 4 is a flow chart illustrating process steps in a method for cooling equipment.

FIG. 4 is a flow chart illustrating process steps in a method 300 for cooling equipment, which may for example be telecommunications equipment. The equipment comprises an air ingress and an air egress. Referring to FIG. 4, the method 300 comprises, in step 310, flowing air across the equipment from the air ingress to the air egress, and, in step 320, compressing air exiting the equipment from the equipment air egress such that a temperature of the air is increased above an air egress temperature.

Finally, the method 300 comprises, in step 330, using a difference between the temperature of the compressed egress air and an ambient temperature to drive a refrigerant cycle to cool air entering the equipment at the equipment air ingress. The method 300 may for example be performed using the cooling systems 100, 200 of FIG. 2 or 3.

Figure 5:
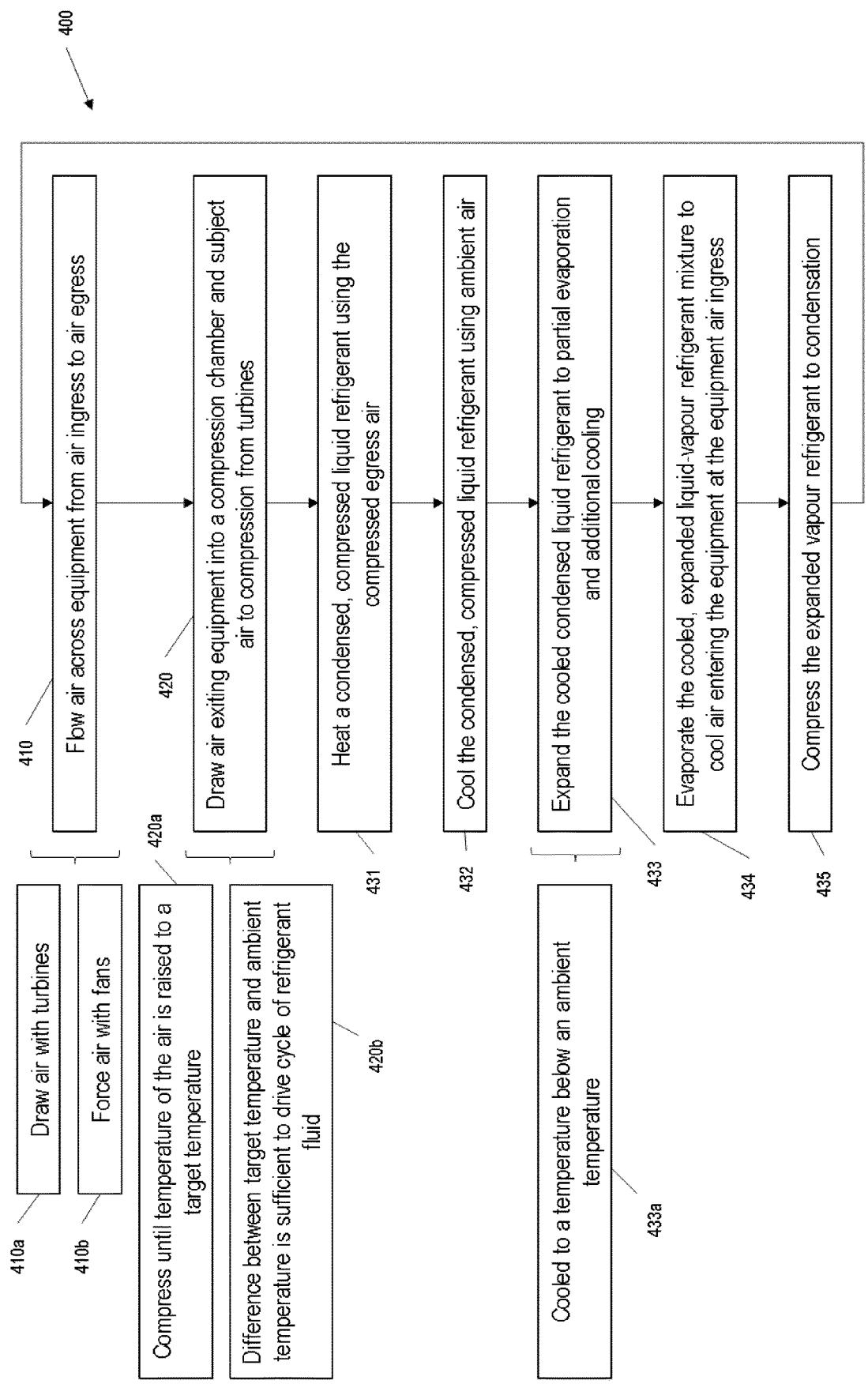
FIG. 5 is a flow chart illustrating process steps in another example of method for cooling equipment.

FIG. 5 is a flow chart illustrating process steps in another method 400 for cooling equipment, which may for example be telecommunications equipment. The equipment comprises an air ingress and an air egress. The steps of the method 400 illustrate one way in which the steps of the method 300 may be implemented to achieve the above discussed and additional functionality.

Referring to FIG. 5, in a first step 410, the method comprises flowing air across the equipment from the air ingress to the air egress. This may be achieved by drawing air across the equipment using turbines providing compression to air exiting the equipment, as illustrated in 410a, or using fans to force the air across the equipment, as illustrated in 410b. In step 420, the method comprises drawing air exiting the equipment into a compression chamber, and subjecting the air to compression from turbines. As illustrated at step 420a, the air is compressed until a temperature of the air is raised to a target temperature. The target temperature is selected such that a difference between the target temperature and an ambient temperature is sufficient to drive a cycle of refrigerant fluid.

In step 431, the method comprises heating a condensed, compressed liquid refrigerant using the compressed egress air, and in step 432, the method comprises cooling the condensed, compressed liquid refrigerant using ambient air. In step 433, the method comprises expanding the cooled condensed liquid refrigerant to partial evaporation and additional cooling. As illustrated at step 433a, step 433 may comprise expanding the cooled condensed liquid refrigerant such that the liquid-vapour refrigerant mixture is cooled to a temperature below an ambient temperature. In step 434 the method comprises evaporating the cooled, expanded liquid-vapour refrigerant mixture to cool air entering the equipment at the equipment air ingress, and at step 435, the method comprises compressing the expanded vapour refrigerant to condensation.

Figure 6:
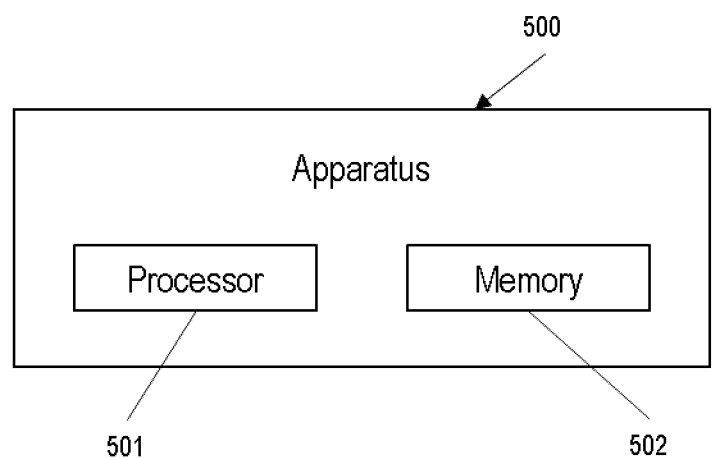
FIG. 6 is a block diagram illustrating apparatus for cooling equipment.

The methods 300, 400 may in some examples be performed by an apparatus configured to implement the method. FIG. 6 illustrates an example apparatus 500 which may implement the methods 300, 400 for example on receipt of suitable instructions from a computer program. Referring to FIG. 6, the apparatus 500 comprises a processor 501 and a memory 502. The memory 502 contains instructions executable by the processor 501 such that the apparatus 500 is operative to conduct some or all of the steps of the method 300 and/or 400.

It will be appreciated that the cooling system, method and apparatus may in different examples be used to cool all or only some equipment located in a particular room or building. In one use case, it may be envisaged that conventional fans and air conditioning are used to cool telecommunications equipment in a data centre room. If the equipment does not have strict thermal constraints in terms of operating temperature, conventional air conditioning and fans may be considered sufficient for the cooling requirements of the equipment. Should a new item of equipment be added however, the new item having significantly more restrictive thermal constrains, using the conventional approach, it would be necessary to increase the air conditioning in the room such that the ambient temperature in the entire room is reduced to a level consistent with the thermal requirements of the signal new item of equipment. This represent a significant increase in power requirement caused by only a single item of equipment. In such a situation, a cooling system, method or apparatus according to examples of the present disclosure may be used to cool only the new item of equipment, such that the thermal constraints of the new equipment are respected without requiring an increase in the air conditioning in the room. This represents a significant saving in energy expenditure. In another use case, it may be envisaged that telecommunications equipment is to be installed in a room or area where no air conditioning is currently installed. Instead of installing air conditioning in the room to enable conventional fan cooling, a cooling system, method or apparatus according to the present disclosure may be used to cool the equipment using the heat generated by the equipment to drive a refrigerant cycle. In this manner, costly installation of air conditioning may be avoided.

Aspects of the present disclosure thus provide a cooling system, method and apparatus then enable a significant reduction in energy expenditure for the cooling of equipment such as telecommunications equipment. By using heat generated by the equipment itself to drive a refrigerant cycle, the need for air conditioning to reduce an ambient temperature of a central office, plant room or data centre is significantly reduced, so reducing power consumption. In addition, compression turbines may assist with drawing air over the equipment, so reducing or eliminating the need for fans to drive this air flow. Reducing the size of such fans, or eliminating them entirely, may reduce undesirable noise from the fans as well as significantly simplifying the design of the relevant equipment. Design of the central office, plant room or data centre may also be simplified with reduced need for air conditioning support.

The methods of the present disclosure may be implemented in hardware, or as software modules running on one or more processors. The methods may also be carried out according to the instructions of a computer program, and the present disclosure also provides a computer readable medium having stored thereon a program for carrying out any of the methods described herein. A computer program embodying the disclosure may be stored on a computer readable medium, or it could, for example, be in the form of a signal such as a downloadable data signal provided from an Internet website, or it could be in any other form.

It should be noted that the above-mentioned examples illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A cooling system for equipment comprising an air ingress and an air egress, the cooling system comprising: a compression chamber comprising a plurality of turbines configured to compress air exiting the equipment via the air egress to an increased pressure such that a temperature of the air exiting the equipment via the air egress is increased to a target temperature; and a refrigerant circuit comprising a condenser coil, an evaporator coil, and a conduit arranged to convey refrigerant fluid between the condenser coil and the evaporator coil, wherein: the evaporator coil is arranged to cool air entering the air ingress, and the condenser coil is located within the compression chamber.

2. The cooling system as claimed in claim 1, wherein the refrigerant circuit further comprises a compressor configured to compress refrigerant vapour exiting the evaporation coil.

3. The cooling system as claimed in claim 2, wherein the compressor is configured to compress the refrigerant vapour to its saturation limit so as to force condensation of the refrigerant vapour.

4. The cooling system as claimed in claim 1, wherein the refrigerant circuit further comprises an expansion valve configured to reduce pressure of refrigerant liquid exiting the condenser coil.

5. The cooling system as claimed in claim 4, wherein the expansion valve is configured to reduce the pressure of the refrigerant liquid such that partial evaporation of the refrigerant liquid occurs.

6. The cooling system as claimed in claim 5, wherein the expansion valve is configured to reduce the pressure of the refrigerant liquid such that the refrigerant liquid-vapour mixture is cooled to a temperature below an ambient temperature.

7. The cooling system as claimed in claim 1, wherein the turbines are configured to draw air across the equipment from the air ingress to the air egress.

8. The cooling system as claimed in claim 1, wherein a difference between the target temperature and an ambient temperature of air entering the equipment via the air ingress is sufficient to drive a refrigerant cycle of the refrigerant fluid through the refrigerant circuit.

9. The cooling system as claimed claim 1, wherein the cooling system further comprises one or more fans arranged to draw air from the air ingress to the air egress.

10. A method for cooling equipment, the equipment comprising an air ingress and an air egress, the method comprising: flowing air across the equipment from the air ingress to the air egress; regulating a plurality of turbines within a compression chamber to compress air exiting the equipment via the air egress to an increased pressure such that a temperature of the compressed exiting air is increased to a target temperature; and using a difference between the temperature of the compressed exiting air and an ambient temperature of air entering the equipment via the air ingress to drive a refrigerant cycle of a refrigerant circuit to cool air entering the equipment via the air ingress, wherein a condenser coil of the refrigerant circuit is also within the compression chamber.

11. The method of claim 10, wherein the plurality of turbines are regulated to: draw the air exiting the air egress into a compression chamber; and compress the air within the compression chamber.

12. The method of claim 10, wherein a difference between the target temperature and the ambient temperature is sufficient to drive the refrigerant cycle of the refrigerant circuit.

13. The method of claim 10, wherein using a difference between the temperature of the compressed exiting air and the ambient temperature of air entering the equipment via the air ingress to drive the refrigerant cycle comprises:
heating a condensed, compressed liquid refrigerant using the compressed exiting air;
cooling the condensed, compressed liquid refrigerant using air entering the equipment via the air ingress;
expanding the cooled condensed liquid refrigerant to facilitate partial evaporation and additional cooling, thereby producing an expanded liquid-vapour refrigerant mixture;
evaporating the expanded liquid-vapour refrigerant mixture to cool air entering the equipment via the air ingress, thereby producing expanded vapour refrigerant; and
compressing the expanded vapour refrigerant to condensation.

14. The method of claim 13, wherein the cooled condensed liquid refrigerant is expanded such that the resulting expanded liquid-vapour refrigerant mixture is at a temperature below the ambient temperature.

15. A non-transitory, computer-readable medium storing computer-executable instructions that, when executed on at least one processor of a cooling system, configure the cooling system to perform operations corresponding to the method of claim 10.

16. An apparatus for cooling equipment comprising an air ingress and an air egress, the apparatus comprising: a processor; and a memory storing computer-executable instructions that, when executed by the processor, configure the apparatus to: flow air across the equipment from the air ingress to the air egress; regulate a plurality of turbines within a compression chamber to compress air exiting the equipment via the air egress to an increased pressure such that a temperature of the compressed exiting air is increased to a target temperature; and use a difference between the temperature of the compressed exiting air and an ambient temperature of air entering the equipment via the air ingress to drive a refrigerant cycle of a refrigerant circuit to cool air entering the equipment via the air ingress, wherein a condenser coil of the refrigerant circuit is also within the compression chamber.

* * * * *